(12) United States Patent
Chen et al.

(10) Patent No.: US 11,444,000 B2
(45) Date of Patent: Sep. 13, 2022

(54) CHARGER

(71) Applicant: Alpha and Omega Semiconductor (Cayman) Ltd., Grand Cayman (KY)

(72) Inventors: Yu-Ming Chen, Hsinchu (TW); Tien-Chi Lin, New Taipei (TW); Guan-Yu Lin, Taipei (TW); Tin-Wei Chen, Taipei (TW)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 829 days.

(21) Appl. No.: 15/953,443

(22) Filed: Apr. 14, 2018

(65) Prior Publication Data

US 2019/0318979 A1    Oct. 17, 2019

(51) Int. Cl.
| | | |
|---|---|---|
| *H01L 23/373* | (2006.01) | |
| *H02J 7/00* | (2006.01) | |
| *H01L 23/498* | (2006.01) | |
| *H01L 23/00* | (2006.01) | |
| *H01L 23/367* | (2006.01) | |

(52) U.S. Cl.
CPC ........ *H01L 23/3736* (2013.01); *H01L 23/367* (2013.01); *H01L 23/49811* (2013.01); *H01L 24/48* (2013.01); *H02J 7/0042* (2013.01); *H01L 2224/4823* (2013.01)

(58) Field of Classification Search
CPC .............. H01L 23/367; H01L 23/3736; H01L 23/49537; H01L 23/49575; H01L 23/49811; H01L 23/49822; H01L 23/49827; H01L 24/48; H01L 2224/4823; H02J 7/0042
See application file for complete search history.

(56) References Cited

U.S. PATENT DOCUMENTS

| | | | | |
|---|---|---|---|---|
| 6,387,732 B1 * | 5/2002 | Akram | ................ | H01L 23/3114 |
| | | | | 257/E23.039 |
| 2004/0212074 A1 * | 10/2004 | Divakar | ............. | H01L 23/3677 |
| | | | | 257/698 |
| 2013/0003309 A1 * | 1/2013 | Stella | ...................... | H01L 24/32 |
| | | | | 361/715 |
| 2013/0140684 A1 * | 6/2013 | Hauenstein | ........... | H01L 23/552 |
| | | | | 257/659 |

* cited by examiner

*Primary Examiner* — Allan R Wilson
(74) *Attorney, Agent, or Firm* — Chen-Chi Lin

(57) ABSTRACT

A charger includes a thermal conductive plate for heat dissipation, and a transistor. The transistor includes a drain terminal of a first pulsating voltage level, and a source terminal of a second pulsating voltage level. The second pulsating voltage level is lower than the first pulsating voltage level. The source terminal is disposed closer to the thermal conductive plate than the drain terminal.

18 Claims, 5 Drawing Sheets

CHARGER

FIELD OF THE INVENTION

The present disclosure relates generally to a power charging apparatus. More particularly, the present disclosure relates to a charger for charging electronic devices.

BACKGROUND OF THE INVENTION

Chargers, such as cell phone chargers, are already known. Since more and more applications, especially multimedia applications running on cell phones, the battery power of a cell phone can be consumed very quickly. Same situation may occur for other consumer electronic devices, like MP3 players, game players, cameras and cell phone Bluetooth headsets. These electronic devices may require frequent recharging. To meet this power demand, portable power supply is developed.

SUMMARY OF THE INVENTION

Embodiments of the present disclosure provide a charger. The charger includes a thermal conductive plate for heat dissipation, and a transistor. The transistor includes a drain terminal of a first pulsating voltage level, and a source terminal of a second pulsating voltage level. The second pulsating voltage level is lower than the first pulsating voltage level. The source terminal is disposed closer to the thermal conductive plate than the drain terminal.

In an embodiment, the source terminal is attached to a carrier, while the drain terminal is wire-bonded and is connected to pins of the carrier.

In another embodiment, the carrier where the source terminal is attached to the thermal conductive plate.

In yet another embodiment, the carrier includes pins attached to the thermal conductive plate.

In still another embodiment, the thermal conductive plate includes a copper clad.

In yet still another embodiment, the thermal conductive plate is disposed on a mother board. The mother board includes a thermal conductive layer in the mother board. The thermal conductive layer is connected to the thermal conductive plate.

In still yet another embodiment, the thermal conductive layer includes a copper clad.

In a further embodiment, the charger further includes a controller configured to control the on-time of the transistor.

In another embodiment, the controller includes one of a pulse-width modulation (PWM) controller or a constant on-time (COT) controller.

In yet another embodiment, the controller and the transistor are co-packaged in a semiconductor device.

In still another embodiment, the charger further includes a transformer, wherein the drain terminal of the transistor is coupled to a dotted terminal of the primary winding of the transformer.

Some embodiments of the present disclosure also provide a charger. The charger includes a thermal conductive plate for heat dissipation, and a semiconductor device. The semiconductor device includes a carrier that includes a die pad, first pins and second pins, and includes a transistor attached to the carrier. The transistor includes a drain terminal of a first pulsating voltage level, and a source terminal of a second pulsating voltage level lower than the first pulsating voltage level. The drain terminal is wire-bonded and is connected to the first pins of the carrier. The source terminal is attached to the die pad of the carrier. The second pins are exposed from the semiconductor device and attached to the thermal conductive plate.

BRIEF DESCRIPTION OF THE DRAWINGS

It is noted that, in accordance with the standard practice in the industry, various features are not drawn to scale. In fact, the dimensions of the various features may be increased or reduced for clarity of discussion.

DETAILED DESCRIPTION OF THE INVENTION

Figure 1:
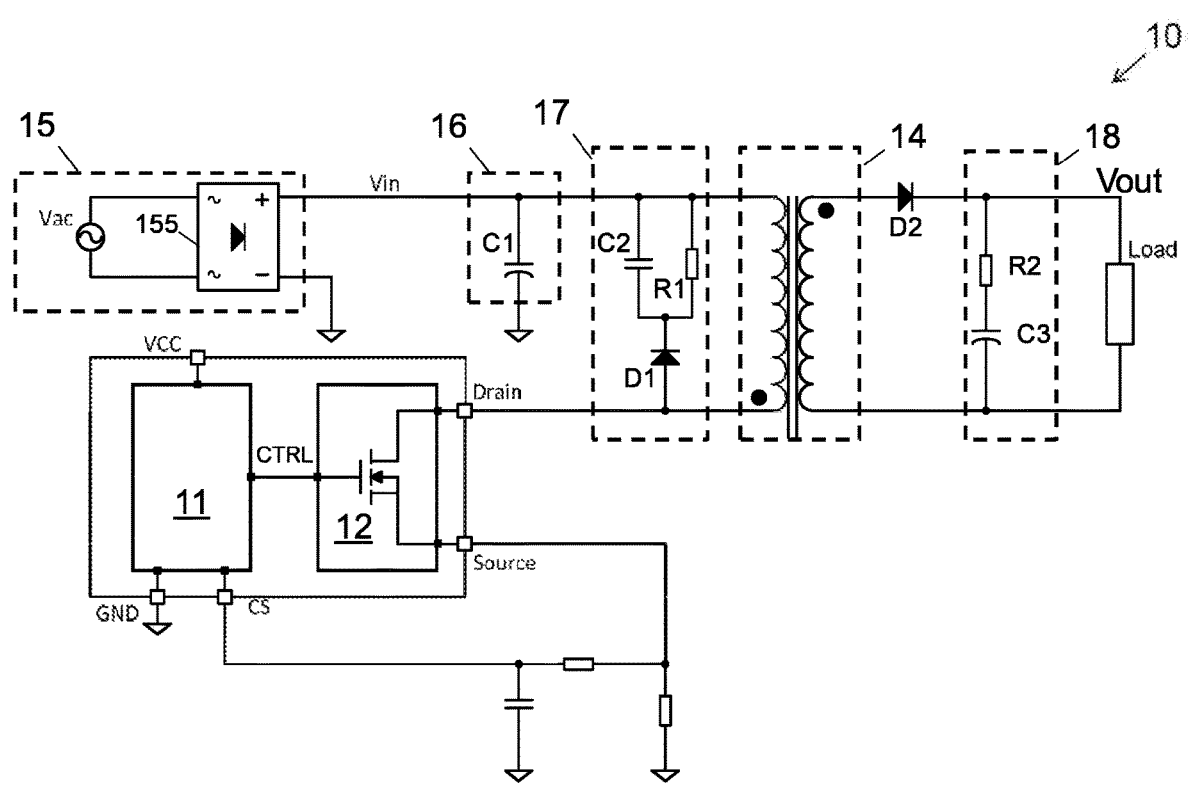
FIG. 1 is a circuit diagram of a charger, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a circuit diagram of a charger 10, in accordance with some embodiments of the present disclosure. The charger 10 may include a portable charger for charging cell phone or other portable electronic devices on-the-go.

Referring to FIG. 1, the charger 10 includes a controller 11, a transistor 12 and a transformer 14. The controller 11 is configured to generate a control signal CTRL that controls on-time and off-time of the transistor 12. In an embodiment, the controller 11 includes a pulse-width modulation (PWM) controller or a constant on-time (COT) controller. The controller 11 detects at a current sensing pin CS the magnitude of current flowing through a source pin of the transistor 12, and determines a duty cycle for the control signal CTRL. By varying the duty cycle of the control signal CTRL provided to the transistor 12, the controller 11 causes the transformer 14 to generate a desired output voltage Vout for an electronic device, a load in FIG. 1. In the present embodiment, the controller 11 and the transistor 12 serve as an AC to DC converter.

The transistor 12 may include a metal-oxide-semiconductor field-effect transistor (MOSFET). A drain terminal of the transistor 12 is connected to a dotted terminal (indicative of polarity) of the primary winding of the transformer 14. A source terminal of the transistor 12, as will be further discussed in detail, is attached to a thermal conductive plate such as a heat sink for heat dissipation. A gate of the transistor 12 is connected to the controller 11 to receive the control signal CTRL. In operation, the drain pulsating voltage may be at least as high as several hundred volts (V), while the source pulsating voltage may be as low as 1V. The drain voltage is significantly larger than the source voltage, and may be larger by at least two orders (a hundred times). The transistor 12 serves as a switch for operation in a high voltage environment.

In the present embodiment, the charger 10 also includes an input stage 15, a filter 16, a snubber 17 and an output stage 18. The input stage 15 is configured to provide an input voltage Vin in response to an alternating-current (ac) voltage Vac, which in turn may be a mains supply voltage. Vac may be 110V in some Asia countries, and may range from 220V to 240V in the U.S. or Europe. The input stage 15 includes a bridge rectifier 155 for transforming Vac into a direct-current (dc) voltage. The voltage Vin is then filtered at the filter 16 to remove AC ripple, and processed at the snubber 17 to suppress voltage transients. In the exemplary embodiment, the filter 16 includes a capacitive element C1 connected between an output of the bridge rectifier 155 and a reference voltage, for example, ground voltage. Moreover, the snubber 17 includes a capacitive element C2 and a resistive element R1 connected in parallel and then together connected in series with a diode D1 between terminals of the primary winding of the transformer 14. An anode of the diode D1 is connected to the dotted terminal of the primary winding of the transformer 14.

The transformer 14 is configured to transform a relatively large input voltage Vin into a relatively small output voltage Vout. The relationship between Vout and Vin can be expressed in an equation below.

$$Vout = Vin \times \frac{D}{1-D} \times \frac{N2}{N1}$$

where D represents the duty cycle of the control signal CRTL, and N1 and N2 represent the number of turns of the primary winding and secondary winding of the transformer 14, respectively.

In an embodiment, Vin is approximately $\sqrt{2Vac}$, while Vout, depending on applications, may generally range from approximately 5 to 12V, or may reach approximately 20V in some cases. The output voltage Vout is provided at the output stage 18. In the exemplary embodiment, the output stage 18 includes a resistive element R2 and a capacitive element C3 connected in series between a cathode of a diode D2 and a non-dotted terminal of the secondary winding of the transformer 14. The resistive element R2 functions as an equivalent series resistor (ESR). An anode of the diode D2 is connected to a dotted terminal of the secondary winding of the transformer 14.

Figure 2A:
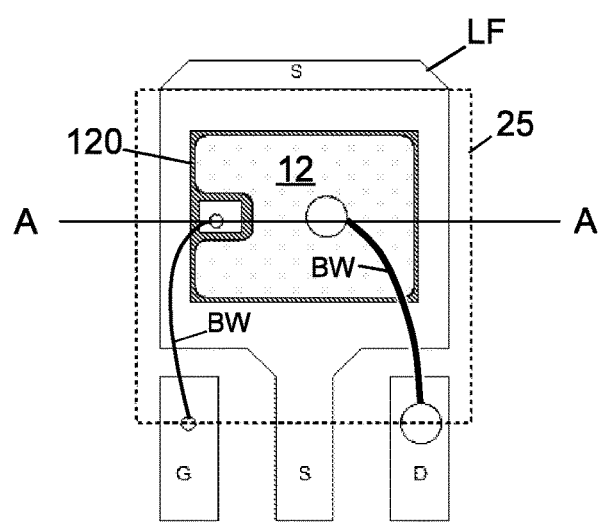
FIG. 2A is a schematic diagram of a transistor of the charger illustrated in FIG. 1, in accordance with some embodiments of the present disclosure.

FIG. 2A is a schematic diagram of the transistor 12 of the charger 10 illustrated in FIG. 1, in accordance with some embodiments of the present disclosure.

Referring to FIG. 2A, the transistor 12 is attached at its source terminal to a support substrate or carrier, for example, a lead frame LF. The lead frame LF includes a die pad 120, first pins D and second pins S. The gate and drain terminals of the transistor 12 are wire bonded via bonding wires BW to corresponding pins G and D of the lead frame LF. The source terminal of the transistor is attached to the die pad 120 of the lead frame LF. The transistor 12 together with the bonding wires BW is encapsulated in molding compound 25 (shown in a dotted rectangular box). Persons having ordinary skill in the art will understand that drain and source terminals of a MOS transistor may be interchangeable, depending on voltage levels applied thereto. For example, in operation a drain voltage generally is higher than a source voltage in an n-type MOS (NMOS) transistor, and is lower than a source voltage in a p-type MOS (PMOS) transistor.

Figure 2B:
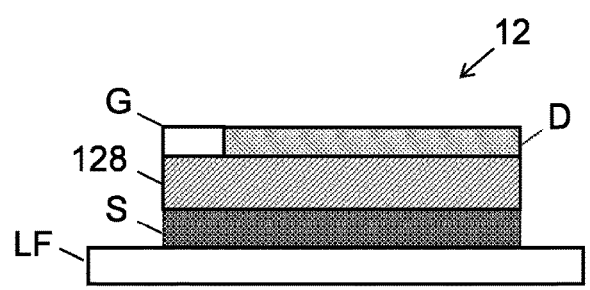
FIG. 2B is a cross-sectional view of the transistor illustrated in FIG. 2A, taken along a line AA.

FIG. 2B is a cross-sectional view of the transistor 12 illustrated in FIG. 2A, taken along a line AA.

Referring to FIG. 2B, the transistor 12 includes a gate terminal G, a drain terminal D, a source terminal S, and an active layer 128 between the drain terminal D and the source terminal S. The active layer 128 may include a semiconductor layer and an interconnection structure to enable transistor functions. The source terminal S and the drain terminal D are disposed on opposite sides of the active layer 128. The source terminal S of the transistor 12 is attached to the lead frame LF, which in turn is attached to a heat sink on a mother board such as a printed circuit board. The transistor 12 thus can be said to have a bottom-source structure, in which the source terminal S is disposed closer to the heat sink than the drain terminal D. Advantages of the transistor 12 with the source S coupled to a heat sink are discussed below.

In existing chargers, in contrast to the top-drain-bottom-source transistor structure in the charger 10 according to the present disclosure, a drain terminal of a transistor is attached to a carrier and then to a heat sink on a printed circuit board. As previously discussed, the drain voltage is higher than several hundred voltages in ACDC applications. For heat dissipation, a relatively large copper clad as a heat sink is required to cool the transistor. However, in the bottom-drain transistor structure, drain pin pulsating voltage is an emitter of electromagnetic influence (EMI). While a large copper clad is used in order to achieve better thermal performance, more intense radiation may occur and worsen the EMI issue. As a result, an efficient EMI filter is needed to alleviate the EMI radiation, which may inevitably complicate the circuit design and increase the cost of a charger.

Unlike the existing chargers, the bottom-source transistor structure has a relatively low source pulsating voltage that may be, as previously discussed, as low as 1V, significantly lower than the drain pulsating voltage. As compared to the existing approaches based on the bottom-drain transistor structure, the charger 10 according to the present disclosure enjoys a relatively large heat sink that enhances thermal performance, while avoids the EMI issue due to a high pulsating voltage as an emission source.

Examples of a bottom-source structure can be found in U.S. Pat. No. 7,394,151 (the '151 patent), entitled "Semiconductor package with Plated Connection," or U.S. Pat. No. 8,008,716 (the '716 patent), entitled "Inverted-Trench Grounded-Source FET Structure with Trenched Source Body Short Electrode," both of which are assigned to the same assignee of the subject application. In particular, a bottom-source structure is disclosed in, for example, FIGS. 7A and 7B and the relevant descriptions in the '151 patent or, for example, FIGS. 2 and 3 and the relevant descriptions in the '716 patent. The relevant disclosures in the '151 and '716 patents are incorporated herein by reference.

Existing transistors, such as planar MOSFETs and trench MOSFETs, that have a bottom-drain structure may also be applicable in the present embodiments without modification. In some embodiments, such transistor is "flipped" with its source terminal facing towards a lead frame, and attached at the source terminal to the lead frame, resulting in the bottom-source structure as illustrated in FIGS. 2A and 2B.

Figure 3A:
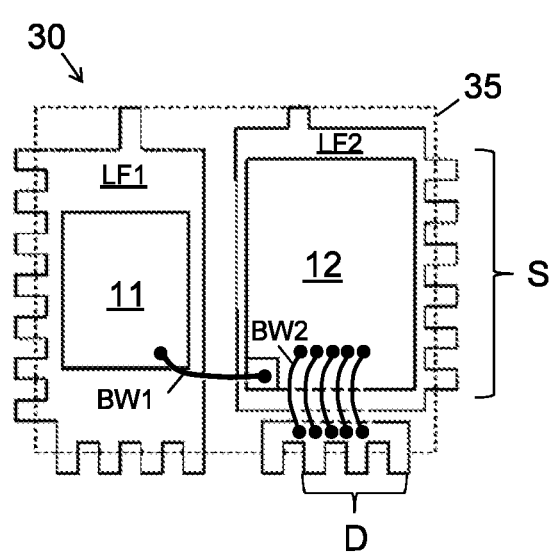
FIG. 3A is a schematic top view of a semiconductor device including a transistor and a controller of the charger illustrated in FIG. 1, in accordance with some embodiments of the present disclosure.

FIG. 3A is a schematic top view of a semiconductor device 30 including the controller 11 and transistor 12 of the charger 10 illustrated in FIG. 1, in accordance with some embodiments of the present disclosure.

Referring to FIG. 3A, the controller 11 and transistor 12 of the charger 10 are co-packaged in the semiconductor device 30. Specifically, the controller 11 attached to a first carrier LF1 and the transistor 12 attached to a second carrier LF2 are encapsulated in molding compound 35. To control the transistor 12, the controller 11 sends a control signal CTRL via a first bonding wire BW1 to a gate of the transistor 12. The drain terminal of the transistor 12 is electrically connected to first pins (drain pins D) of the second carrier LF2 via second bonding wires BW2. The second carrier LF2 includes several drain pins in view of a relatively large drain voltage.

Figure 3B:
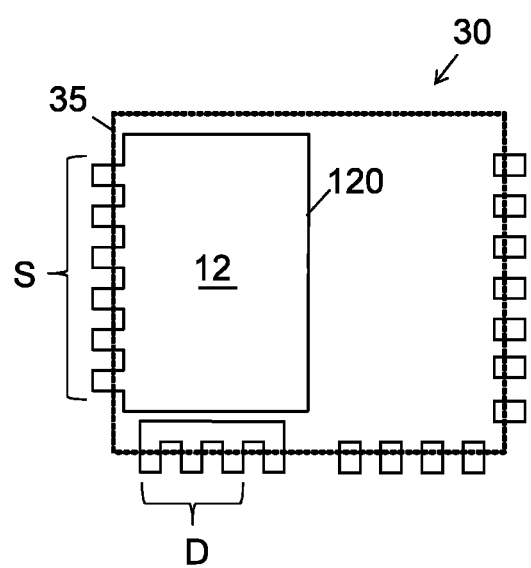
FIG. 3B is a bottom view of the semiconductor device illustrated in FIG. 3A.

FIG. 3B is a bottom view of the semiconductor device 30 illustrated in FIG. 3A. Referring to FIG. 3B, a number of second pins (source pins S) of the second carrier LF2 are exposed from the semiconductor device 30. These exposed source pins S work in conjunction with a heat sink to facilitate heat dissipation.

Figure 4:
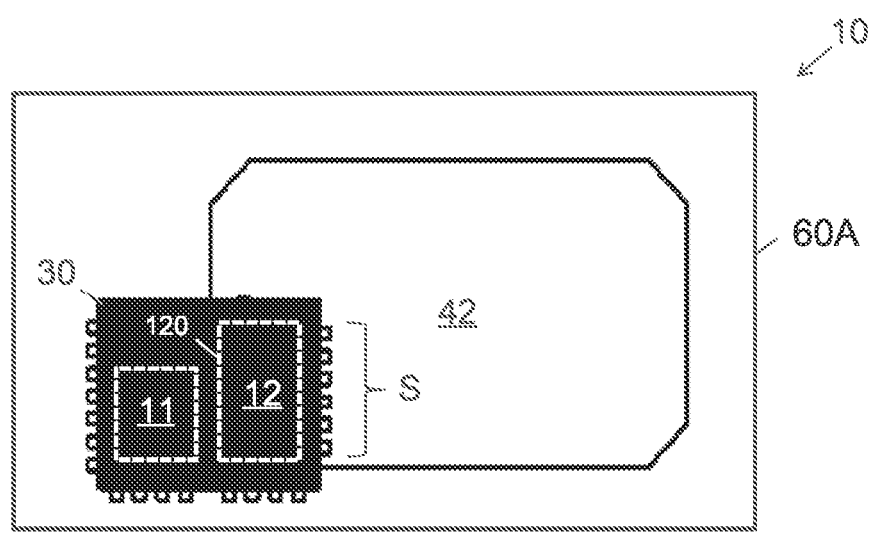
FIG. 4 is a schematic diagram of the charger illustrated in FIG. 1, in accordance with some embodiments of the present disclosure.

FIG. 4 is a schematic diagram of the charger 10 illustrated in FIG. 1, in accordance with some embodiments of the present disclosure.

Referring to FIG. 4, the second carrier LF2 is attached to a heat sink 42 on a mother board 60A by, for example, solder paste. In the present embodiment, the die pad 120 where the source terminal of the transistor 12 is seated is attached to the heat sink 42. Heat generated by the semiconductor device 30, in particular the transistor 12, may be dissipated via the bottom source terminal towards the heat sink 42, and may also be dissipated via the exposed source pins S towards the heat sink 42. The exposed source pins S thus provide an additional heat dissipation path.

Figure 5:
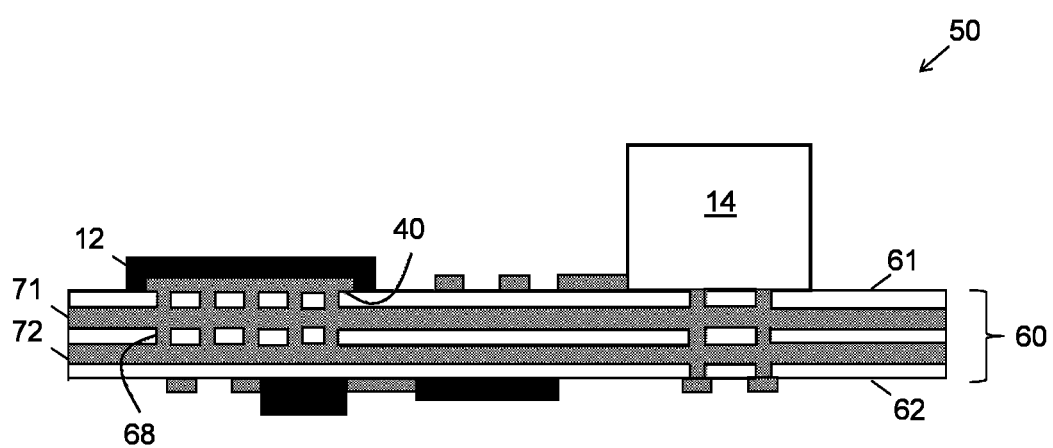
FIG. 5 is a cross-sectional view of a charger, in accordance with some embodiments of the present disclosure.

FIG. 5 is a cross-sectional view of a charger 50, in accordance with some embodiments of the present disclosure.

Referring to FIG. 5, the charger 50 includes a transistor 12 and a transformer 14, which are disposed on a first surface 61 of a mother board 60. In the present embodiment, the transistor 12 is packaged as a single semiconductor device. Alternatively, as shown in FIG. 3A, the transistor 12 may be co-packaged with a controller 11 in a semiconductor device. The source terminal of the transistor 12 is attached to a carrier, which in turn is attached to a copper clad 40 disposed on the first surface 61. The copper clad 40 serves as a heat sink. The mother board 60 includes at least one thermal conductive layer for heat dissipation. In the present embodiment, the at least one thermal conductive layer includes copper clad layers 71 and 72 embedded in the mother board 60. In other embodiments, the number of copper clad layers is not limited to two. The additional copper clad layers 71 and 72 are coupled with the copper clad 40 through conductive vias 68 in order for heat dissipation from the transistor 12 via the copper clad 40 on the first surface 61 and the copper clad layers 71, 72 towards a second surface 62 of the mother board 60.

Those of ordinary skill in the art may recognize that modifications of the embodiments disclosed herein are possible. For example, a total number of pins may vary. Other modifications may occur to those of ordinary skill in this art, and all such modifications are deemed to fall within the purview of the present invention, as defined by the claims.

What is claimed is:

1. A charger, comprising:
   a thermal conductive plate for heat dissipation; and
   a transistor, comprising:
      a drain terminal of a first pulsating voltage level; and
      a source terminal of a second pulsating voltage level lower than the first pulsating voltage level;
   wherein the source terminal is connected to the thermal conductive plate;
   wherein the thermal conductive plate is disposed on a first surface of a mother board;
   wherein the mother board comprises one or more thermal conductive layers embedded in the mother board between the first surface and a second surface opposite the first surface;
   wherein the one or more thermal conductive layers are connected to the thermal conductive plate; and
   wherein the thermal conductive plate is between the transistor and the mother board.

2. The charger of claim 1, wherein the thermal conductive plate includes a copper clad.

3. The charger of claim 1, wherein the one or more thermal conductive layers include one or more copper clads.

4. The charger of claim 1 further comprising:
   a controller configured to control on-time of the transistor.

5. The charger of claim 4, wherein the controller includes one of a pulse-width modulation (PWM) controller or a constant on-time (COT) controller.

6. The charger of claim 5, wherein the controller and the transistor are co-packaged in a semiconductor device.

7. The charger of claim 1 further comprising a transformer, wherein the drain terminal of the transistor is coupled to a dotted terminal of a primary winding of the transformer.

8. A charger, comprising:
   a thermal conductive plate for heat dissipation; and
   a transistor, comprising:
      a drain terminal of a first pulsating voltage level; and
      a source terminal of a second pulsating voltage level lower than the first pulsating voltage level;
   wherein the source terminal is connected to the thermal conductive plate;
   wherein the thermal conductive plate is disposed on a first surface of a mother board;
   wherein the mother board comprises one or more thermal conductive layers embedded in the mother board between the first surface and a second surface opposite the first surface;
   wherein the one or more thermal conductive layers are connected to the thermal conductive plate; and
   wherein the source terminal is attached to a carrier and wherein the drain terminal is wire-bonded and is connected to a first plurality of pins of the carrier.

9. The charger of claim 8, wherein the carrier includes a second plurality of pins attached to the thermal conductive plate.

10. A charger, comprising:
    a thermal conductive plate for heat dissipation; and
    a semiconductor device, comprising:
       a carrier comprising a die pad, a first plurality of pins and a second plurality of pins; and a transistor attached to the carrier, the transistor comprising:
 a drain terminal of a first pulsating voltage level, the drain terminal being wire-bonded and being connected to the first plurality of pins of the carrier; and
 a source terminal of a second pulsating voltage level lower than the first pulsating voltage level, the source terminal being attached to the die pad of the carrier,
wherein the second plurality of pins are connected to the die pad;
wherein the second plurality of pins are exposed from the semiconductor device; and
wherein the second plurality of pins are attached to the thermal conductive plate.

11. The charger of claim 10, wherein the die pad of the carrier is attached to the thermal conductive plate.

12. The charger of claim 10, wherein the thermal conductive plate includes a copper clad.

13. The charger of claim 10, wherein the thermal conductive plate is disposed on a mother board;
 wherein the mother board comprises a thermal conductive layer embedded in the mother board; and
 wherein the thermal conductive layer is connected to the thermal conductive plate.

14. The charger of claim 13, wherein the thermal conductive layer includes a copper clad.

15. The charger of claim 10 further comprising:
 a controller configured to control on-time of the transistor.

16. The charger of claim 15, wherein the controller includes one of a pulse-width modulation (PWM) controller or a constant on-time (COT) controller.

17. The charger of claim 16, wherein the controller and the transistor are co-packaged in the semiconductor device.

18. The charger of claim 10 further comprising a transformer, wherein the drain terminal of the transistor is coupled to a dotted terminal of a primary winding of the transformer.

* * * * *